June 13, 1967 F. P. MANETTI ET AL 3,325,692

MOUNTING BRACKET FOR ELECTRICAL EQUIPMENT CHASSIS

Filed Dec. 14, 1965

INVENTORS
FRED P. MANETTI
JOSEPH F. STEGER
BY
Petherbridge, O'Neill & Aubel
Attys.

United States Patent Office 3,325,692

Patented June 13, 1967

3,325,692

MOUNTING BRACKET FOR ELECTRICAL EQUIPMENT CHASSIS

Fred P. Manetti, River Forest, and Joseph F. Steger, River Grove, Ill., assignors to American Plasticraft Company, Chicago, Ill., a corporation of Illinois Filed Dec. 14, 1965, Ser. No. 521,480

4 Claims. (Cl. 317—101)

The present invention generally relates to mounting brackets, and it more particularly relates to mounting brackets for insulatively mounting a chassis on a base such as another chassis or a cabinet for electronic equipment.

In various types of electronic equipment such as television receivers, different portions of the circuit are mounted on separate chassis members. For example, television receivers commonly employ a main chassis operated at power line ground potential and another chassis operated at a substantially higher potential. For convenience, of installation, it is often desirable to mount one chassis on the other chassis. Insulating types of brackets or fasteners have in the past been employed for this purpose, but they have not proven to be altogether satisfactory for the reason that they are difficult to assemble and, in some cases, difficult to form by molding.

Therefore, a principal object of the present invention is to provide a new and improved bracket for securing one member to another while simultaneously electrically insulating said members from one another.

Another object of the present invention is to provide a new and improved mounting bracket for mounting chassis.

A further object of the present invention is to provide a new and improved chassis mounting bracket which can be molded of an insulating plastic material.

The above and further objects and a better understanding of the present invention may be had by reference to the following detailed description taken in connection with the accompanying drawings in which.

Figure 1:
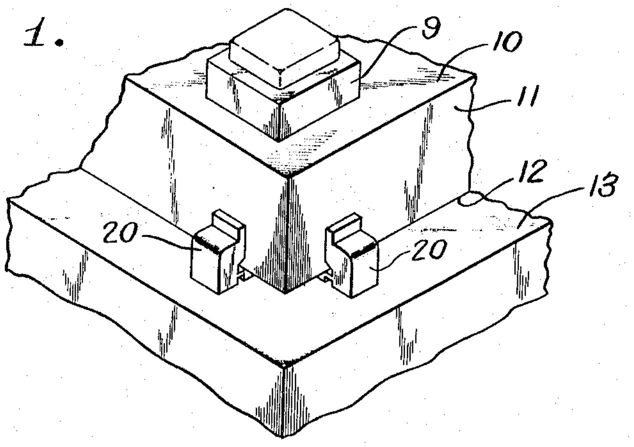
FIG. 1 is a fragmentary view of a chassis for electronic equipment secured to another chassis and insulated therefrom by mounting brackets according to the present invention.

An assembly incorporating features of the invention as shown in FIG. 1, the assembly includes a chassis 10 on which may be mounted electronic components such as electron tubes, transistors or transformers 9. The chassis 10 includes downwardly depending panels or walls 11 having a bottom or marginal edge 12 arranged to be positioned on a mounting base or support member 13 which base may comprise another electronic chassis. One or more of the panels 11 includes apertures 14, as better shown in FIG. 2, formed near the bottom edge 12 of the panel 11. The apertures 14 are spaced from the bottom edge 12 of the panel 11 by a ledge piece or lip 15, for purposes to be described. Brackets 20 constructed in accordance with the invention are inserted in the apertures 14 to mount the chassis 10 and base 13.

Figure 2:
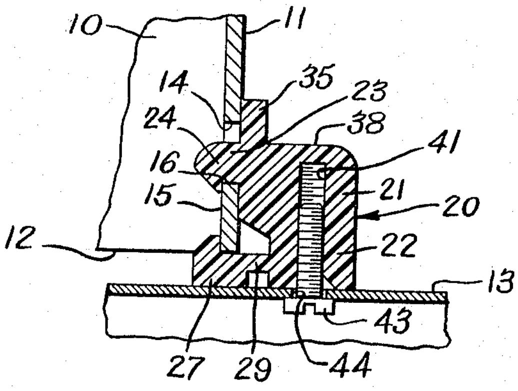
FIG. 2 is a sectional view taken along the center line of the mounting bracket of FIG. 1 and illustrating the bracket in use.

Each bracket 20 includes a body portion 21 having a base section 22 and an upper attachment section 23, see also FIGS. 2–5. The upper attachment section 23 includes a shoulder or jaw 24 having a downwardly and inwardly tapered forward or outer surface 25 and an inner or after vertical surface 26. The shoulder 24 on the upper attachment section 23 is arranged to pass through the associated aperture 14 in the panel 11 and engage the panel 11 as best shown in FIGS. 1 and 2.

A lower attachment section 27 of bracket 20 is connected to the base section 22 of bracket 20 by a flange 29. The flange 29 is relatively flexible so as to permit the lower attachment section 27 to flex, for purposes of inserting the bracket 20 into its associated aperture 14 in the chassis 10, as will be explained more fully hereinbelow.

The shouder 24 is cut away or beveled as at 40 to have a narrowed forward width dimension to permit the upper shoulder 24 to be more easily inserted into the slot; i.e., it permits finding and positioning of the bracket in the aperture 14, particularly when the width dimension of the bracket and the aperture have relatively close tolerances.

The base section 22 and the lower attachment section 27 each have a bottom surface 30 adapted for resting on the surface of the mounting base 13. An upstanding lower shoulder or jaw 31 is formed on the lower attachment 27. The lower shoulder 31 is spaced from the upper shoulder 24 a distance less than the distance between the lower edge of the aperture 14 and the bottom edge of the panel 11, comprising the lip 15 for purposes to be explained. The shoulder 31 includes an upwardly and inwardly tapered forward surface 32 and an after vertical surface 33. The tapered forward surfaces of shoulders 24 and 31 facilitate the insertion of the bracket 20 into position in its associated aperture 14 in panel 11. The shoulder 31 is arranged to pass under the bottom surface 12 of the panel 11 and engage the panel.

A stop 35 is formed on the upper surface 38 of the body portion 21 to extend upwardly therefrom. The stop 35 bears against the outer surface of the panel 11 when the bracket 20 is in position in its associated aperture 14.

A slot 36 of rectangular configuration is formed between the vertical surface 26 of shoulder 24 and the body portion 21. The slot 36 is dimensioned to receive the thickness dimension of the ledge piece 15.

An enlarged recess 37 is formed in the body portion 21 immediately above the flange 29 and behind the vertical surface 33 for purposes of permitting easy insertion of the bracket 20 into its associated aperture 14 in the chassis 10, as will be described hereinbelow. The upper surface of the flange 29 forms the lower extremity of the recess 37, and the recess is tapered upwardly and outwardly as at 39 and opens into the slot 36.

A blind cylindrical hole 41 extends upwardly from the bottom surface 30 through the body portion 21 for receiving a screw and securing the bracket 20 to the mounting base 13.

Figure 3:
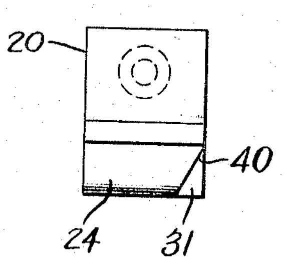
FIG. 3 is a top plan view of a mounting bracket embodying the present invention.
Figure 4:
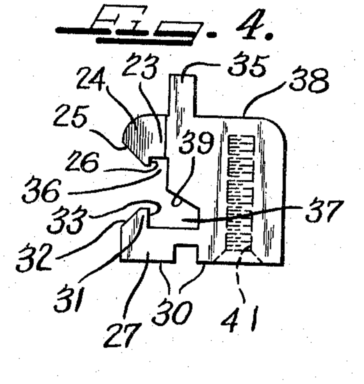
FIG. 4 is a side elevational view of the mounting bracket of FIG. 2.
Figure 5:
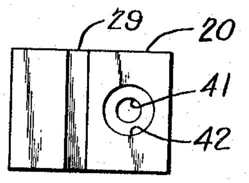
FIG. 5 is a bottom plan view of the mounting bracket of FIG. 2.

As can best be seen from FIGS. 3 and 5, the body portion 21, the base section 22 and the attachment sections 23 and 27 are of the same width; the width being the dimension measured parallel to mounting base 13 and also parallel to panel 11. The depth dimension of the bracket 20 is measured parallel to the mounting base 13 and perpendicularly to the panel 11, and is best seen in FIG. 2. The depth of the upper portion of the bracket 20, including the upper attachment section 23 plus the body portion 21, is the same as the depth of the lower portion of bracket 20 including the lower attachment section 27, the flange 29 and the base section 22. The height dimension of the bracket 20 is measured perpendicularly to the mounting base 13 and parallel to the panel 11. The height of the body portion 21 is the same as the height measured from the bottom surface 30 of the lower attachment section 27 to the upper surface 38 of the upper attachment section 23.

When assembling the bracket 20 in the panel 11, the shoulder 31 of the lower attachment section 27 is pushed past the bottom edge 12 of the panel 11, the bottom edge 12 is received in the recess 37. Then the bracket 20 is pushed and tilted forward such that the shoulder 24 on the upper attachment section 23 is inserted into its associated aperture 14 and the shoulder engages behind the ledge piece 15. The relatively flexible flange 29 permits the lower attachment section 27 to yield somewhat as the tapered surface 25 of the shoulder 24 rides over the upper edge 16 of the ledge piece 15 and into position in aperture 14. When the lower tip of shoulder 24 moves past the upper edge 16 of ledge piece 15, the resiliency of the bracket 20 causes the attachment section 27 to snap back and resume its initial form to lock the bracket 20 in position in panel 11.

Next the chassis 10 is positioned on the mounting base 13 so that the holes 41 in the bracket 20 are in substantial alignment with a plurality of punched-out holes 44 in the mounting base 13. The screw type fasteners 43 are then inserted up through the holes 44 in mounting base 13 and threaded into the holes 41 in the bracket 20 thereby firmly securing the bracket to the mounting base 13. In order to facilitate mounting of the chassis 10, the holes 41 in bracket 20 are counterbored at 42. This simplifies alignment of the holes 41 of bracket 20 with punched-out mounting holes 44 in the mounting base 13.

The apertures 14 in panel 11 are spaced from the lower marginal edge 12 by a distance equal to or very slightly greater than the distance between the upper surface of slot 36 in body portion 21 and the top surface of the flange 29. The apertures 14 have a width at least equal to the width of the upper attachment section 23; and, the apertures have a height equal to the height of the upper attachment section 23 so that the shoulder 24 may be inserted into an associated aperture 14. Thus, the ledge piece 15, the apertures 14 and the brackets 20 are dimensioned such that the brackets 20 securely engages the ledge piece 15. The stop member 35 is arranged to bear against the outer surface of the panel 11 to brace the bracket 20 against the panel 11 to securely position the chassis 10 on mounting base 13.

While the present invention has been described in connection with a particular embodiment thereof, it will be understood that those skilled in the art may make many changes and modifications without departing from the true spirit and scope of the invention. Therefore, it is intended by the appended claims to cover all such changes and modifications which fall within the true spirit and scope of the invention.

We claim:

1. A mounting bracket suitable for mutually insulating a pair of electronic chassis from one another and for securing said two chassis together, comprising:

(a) a unitary molded member formed of an electric insulating material; and including (b) a body section having an upstanding side surface and a base portion;

(c) said body section including elongated bore means extending through said base portion for receiving a fastener;

(d) an upper attachment section extending forwardly from said body section and having a downwardly depending shoulder means;

(e) a lower attachment section extending forwardly from said body section and having an upwardly extending shoulder means;

(f) said body section and said upper and lower attachment sections being of substantially the same width; and (g) a resilient flange connecting said lower attachment section to said body section.

2. A bracket as in claim 1 wherein said body section has a slot formed adjacent said attachment sections for receiving a portion of the thickness of the wall of said chassis, and an offset recess formed with said slot, the upper surface of said flange forming the lower bounds of said recess, and the upper surface of said recess being tapered upwardly and outwardly and opening at said slot.

3. In combination:

(a) a first mounting wall on a first electronic chassis;

(b) a second mounting wall on a second electronic chassis;

(c) said walls being substantially flat and in mutually perpendicular relationship with one edge of said second wall extending adjacent to said first wall, said second wall having at least one aperture formed adjacent said one edge; and (d) an insulating mounting bracket interconnecting said two chassis;

(e) said bracket being formed of an insulating material and including a body section having a downwardly opening hole;

(f) a fastening device received in said hole and securing said bracket to said first mounting wall adjacent to said second mounting wall;

(g) said body section having an upstanding side surface disposed against the wall of said second chassis and having a base portion resting on said first chassis;

(h) an upper attachment section extending forwardly from said body section and having a downwardly depending shoulder means extending through an aperture in said second wall to engage behind said second wall;

(i) said body section and said upper and lower attachment sections being of substantially the same width;

(j) a resilient flange connecting said lower attachment section to said body section;

(k) said flange and said lower attachment section extending beneath said bottom edge of said second chassis; and (l) said lower attachment section including an upwardly projecting shoulder means for engaging behind said second wall.

4. A mounting bracket as in claim 1 further including an upwardly extending stop formed on said upper attachment section in spaced relation to said shoulder means.

References Cited

UNITED STATES PATENTS

| | | | |
|---|---|---|---|
| 3,084,211 | 4/1963 | Rapata | 174—158 |
| 3,155,771 | 11/1964 | Steger et al. | 174—158 |

LARAMIE E. ASKIN, *Primary Examiner.*